United States Patent
Moriya

(10) Patent No.: US 7,485,946 B2
(45) Date of Patent: Feb. 3, 2009

(54) TRANSISTOR EPITAXIAL WAFER AND TRANSISTOR PRODUCED BY USING SAME

(75) Inventor: Yoshihiko Moriya, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 225 days.

(21) Appl. No.: 11/637,112

(22) Filed: Dec. 12, 2006

(65) Prior Publication Data

US 2007/0158685 A1    Jul. 12, 2007

(30) Foreign Application Priority Data

Dec. 13, 2005   (JP)   ............................. 2005-358809
Nov. 20, 2006   (JP)   ............................. 2006-313513

(51) Int. Cl.
   *H01L 29/00*   (2006.01)
(52) U.S. Cl. ................ 257/552; 438/235; 257/E29.033
(58) Field of Classification Search ................ 257/552, 257/560, 561, 562, 563, 564, E29.033; 438/235, 438/236

See application file for complete search history.

(56) References Cited

U.S. PATENT DOCUMENTS 7,148,557 B2 * 12/2006 Yanagihara et al. ......... 257/577

FOREIGN PATENT DOCUMENTS

JP    2003-133325    5/2003

* cited by examiner

*Primary Examiner*—Quoc D Hoang
(74) *Attorney, Agent, or Firm*—McGinn IP Law Group, PLLC

(57) ABSTRACT

A transistor epitaxial wafer having: a substrate; an n-type collector layer, a p-type base layer and an n-type emitter layer formed on the substrate in this order; and an n-type InGaAs non-alloy layer having an n-type InGaAs nonuniform composition layer formed on the n-type emitter layer and having an nonuniform indium (In) composition, and an n-type InGaAs uniform composition layer formed on the n-type InGaAs nonuniform composition layer and having a uniform indium (In) composition. The n-type InGaAs nonuniform composition layer has a first layer doped with Si and having a low indium (In) composition, and a second layer formed on the first layer, doped with an n-type dopant except Si, and having an indium (In) composition higher than the first layer.

17 Claims, 10 Drawing Sheets

TRANSISTOR EPITAXIAL WAFER AND TRANSISTOR PRODUCED BY USING SAME

The present application is based on Japanese patent application Nos.2005-358809 and 2006-313513, the entire contents of which are incorporated herein by reference.

BACKGROUND OF THE INVENTION

1. Field of the Invention

This invention relates to a transistor epitaxial wafer and, in particular, to a structure of an n-type InGaAs non-alloy layer thereof. Also, this invention relates to a transistor produced by using the transistor epitaxial wafer.

2. Description of the Related Art

A high-frequency device using a compound semiconductor such as GaAs is widely used for an amplifier etc. of a mobile phone and other communication devices since it can provide frequency characteristics with low distortion and good efficiency at GHz or more. Above all, a heterojunction bipolar transistor (hereinafter referred to as "HBT") using a heterojunction for an emitter/base junction has excellent frequency characteristics and is widely used as a high-output transistor for a mobile phone since its emitter layer has wider bandgap than its base layer to allow a high emitter injection efficiency.

The emitter/base junction of the HBT has been generally composed of an AlGaAs/GaAs heterojunction. However, in recent years, the AlGaAs emitter layer is positively replaced by an InGaP emitter layer in order to enhance the device characteristics or reliability.

FIG. 7 illustrates the structure of a conventional HBT. The HBT 300 is an InGaP/GaAs-based HBT. An epitaxial wafer used in the HBT comprises, grown on a semi-insulating GaAs substrate 1 by a vapor-phase epitaxy such as MOVPE and MBE, an n-type sub-collector layer 2, an n-type collector layer 3, a p-type base layer 4, an n-type InGaP emitter layer (or an n-type AlGaAs) 5, an n-type GaAs emitter contact layer 6, and an n-type InGaAs non-alloy layer 14.

Silicon (Si) is generally used as an n-type dopant, and carbon (C), zinc (Zn) or beryllium (Be) is used as a p-type dopant element.

In the HBT 300, an emitter electrode 11 is formed on the n-type InGaAs non-alloy layer 14, a base electrode 12 is formed on the p-type base layer 4, and a collector electrode 13 is formed on the n-type sub-collector layer 2. In operation with the emitter grounded, positive voltages Vb, Vc are applied to the base electrode 12 and the collector electrode 13, respectively, and base current Ib as a signal input is fed from the base electrode 12 to control collector current Ic as an output to operate as a transistor.

In order to reduce the power consumption of the HBT 300, it might be assumed to lower a resistance component of the following portions (1) to (5).

(1) Contact resistance of the n-type InGaAs non-alloy layer 14 contacting the emitter electrode 11.
(2) Contact resistance of the base layer 4 contacting the base electrode 12.
(3) Contact resistance of the sub-collector layer 2 contacting the collector electrode 13.
(4) Resistance in each the epitaxial layers.
(5) Interface resistance between the epitaxial layers.

Above all, the contact resistance of the n-type InGaAs non-alloy layer 14 contacting the emitter electrode 11 as mentioned in (1) is likely to increase since the size of the n-type InGaAs non-alloy layer 14 is smaller than the electrode size of the base layer 4 and the sub-collector layer 2. In consideration of this, the n-type InGaAs non-alloy layer 14 has an In composition as high as 0.4 to 0.7 and it is doped at a high doping concentration of $1 \times 10^{19}$ cm$^{-3}$ or more.

On the other hand, when the n-type InGaAs non-alloy layer 14 with a high In composition is directly grown on the GaAs emitter contact layer 6, a number of defects are generated at the interface of the GaAs and the InGaAs since the lattice constant of InGaAs of the non-alloy layer 14 is significantly different from that of the GaAs layer 6. Thus, in order to reduce the number of the defects as much as possible, the n-type InGaAs non-alloy layer 14 is formed of a linear graded layer (i.e., an $In_{0 \to x}Ga_{1 \to 1-x}As$ linear graded layer) where the In composition is gradually increased from 0 to a desired uniform In composition value (a final value), and then a uniform In composition layer (i.e., an $In_xGa_{1-x}As$ non-alloy layer with a uniform In composition) is grown thereon which has an In composition fixed to the final value.

Further, when Si is used as an n-type dopant to obtain the n-type InGaAs non-alloy layer 14 with a low resistance, it is difficult to obtain the layer 14 with a carrier concentration of $1 \times 10^{19}$ cm$^{-3}$ or more since the doping efficiency of Si is lower than that of Se or Te. Thus, although it is needed to use the more dopant to have the high carrier concentration, the growth temperature of the n-type InGaAs non-alloy layer 14 must be increased to do that. Because of this, the surface flatness of the n-type InGaAs non-alloy layer 14 will deteriorate. On the other hand, when Se or Te with high doping efficiency is used as the n-type dopant, the surface flatness of the n-type InGaAs non-alloy layer 14 can be improved and the contact resistance thereof can be reduced. However, the Se or Te may diffuse into the emitter layer 5 during the growth since the Se or Te has a higher diffusion coefficient than Si.

JP-A-2003-133325 teaches a non-alloy layer structure constructed such that, as shown in FIG. 7, the n-type InGaAs non-alloy layer 14 comprises a linear graded layer 15 having an In composition varied linearly from 0 to 0.5 and a non-alloy layer (i.e., a uniform composition layer) 16 formed thereon with a fixed In composition of 0.5, and Se is doped into the upper uniform composition layer 16. Thus, the surface flatness of the n-type InGaAs non-alloy layer 14 can be improved and the contact resistance thereof can be reduced. Further, Si is doped into the lower linear graded layer 15 to suppress the diffusion of Se into the n-type emitter layer 5 to have high reliability.

However, even when the Se is doped into the uniform composition layer 16 of the n-type InGaAs non-alloy layer 14 and the Si is doped into the linear graded layer 15 thereof, there is still room for improvement since the n-type InGaAs non-alloy layer 14 does not have a low contact resistance under some growth conditions on the In composition etc., and the flatness thereof is not adequate yet.

Further, when the Si is doped into the linear graded layer 15 of the n-type InGaAs non-alloy layer 14, it causes the excessive doping of the Se into the upper non-alloy layer (n-type InGaAs layer) 16 so as to reduce the contact resistance since the contact resistance of the linear graded layer 15 cannot be reduced completely. Thus, at the next epitaxial growth, the remaining Se may be mixed into the n-type sub-collector layer 2 and the n-type collector layer 3 as a memory material to cause an increase in, especially, collector capacitance. Furthermore, when the doping amount of Se is increased, a thorn-shaped projection 17 as shown in FIG. 8 can be generated in etching the non-alloy layer 16 by using an acid based etchant. Thus, reliability of the HBT will lower.

SUMMARY OF THE INVENTION

It is an object of the invention to provide a transistor epitaxial wafer that allows an n-type InGaAs non-alloy layer to have a sufficiently low resistance and an improved surface flatness.

It is a further object of the invention to provide a transistor produced by using the transistor epitaxial wafer.

(1) According to one aspect of the invention, a transistor epitaxial wafer comprises:
a substrate;
an n-type collector layer, a p-type base layer, and an n-type emitter layer formed on the substrate in this order; and
an n-type InGaAs non-alloy layer comprising an n-type InGaAs nonuniform composition layer formed on the n-type emitter layer and comprising an nonuniform indium (In) composition, and an n-type InGaAs uniform composition layer formed on the n-type InGaAs nonuniform composition layer and comprising a uniform indium (In) composition,
wherein the n-type InGaAs nonuniform composition layer comprises a first layer doped with Si and comprising a low indium (In) composition, and a second layer formed on the first layer, doped with an n-type dopant except Si, and comprising an indium (In) composition higher than the first layer.

(2) According to another aspect of the invention, a transistor epitaxial wafer comprises:
a substrate;
a buffer layer, an electron donating layer, a channel layer, and a Schottky layer formed on the substrate in this order; and
an n-type InGaAs non-alloy layer comprising an n-type InGaAs nonuniform composition layer formed on the Schottky layer and comprising an nonuniform indium (In) composition, and an n-type InGaAs uniform composition layer formed on the n-type InGaAs nonuniform composition layer and comprising a uniform indium (In) composition,
wherein the n-type InGaAs nonuniform composition layer comprises a first layer doped with Si and comprising a low indium (In) composition, and a second layer formed on the first layer, doped with an n-type dopant except Si, and comprising an indium (In) composition higher than the first layer.

In the above invention (1) or (2), the following modifications and changes can be made.

(i) The n-type InGaAs nonuniform composition layer comprises a graded layer comprising an In composition gradually increased from 0,
the first layer comprises an In composition of 0 to 0.35,
the second layer comprises an In composition of more than 0.35, and
a final value of the In composition of the second layer near an interface between the second layer and the uniform composition layer is substantially equal to the In composition of the uniform composition layer.

(ii) The first layer comprises an In composition of 0 to 0.35, and
the second layer comprises an In composition in the range 0.35 to the In composition of the uniform composition layer.

(iii) The first layer comprises a carbon (C) background concentration of not more than $1 \times 10^{18}$ cm$^{-3}$ at the In composition thereof.

(iv) The n-type dopant except Si of the second layer comprises Se or Te.

(v) The second layer comprises a carbon (C) background concentration of not more than $1 \times 10^{18}$ cm$^{-3}$ at the In composition thereof.

(vi) The n-type InGaAs uniform composition layer comprises Se or Te as an n-type dopant thereof.

(vii) The substrate comprises GaAs, Si or InP.

(3) According to another aspect of the invention, a transistor comprises:
a substrate;
an n-type sub-collector layer, an n-type collector layer, a p-type base layer, and an n-type emitter layer formed on the substrate in this order;
an n-type InGaAs non-alloy layer formed on the emitter layer, comprising an n-type InGaAs nonuniform composition layer and an n-type InGaAs uniform composition layer formed on the n-type InGaAs nonuniform composition layer and comprising a uniform indium (In) composition, the nonuniform composition layer comprising a first layer doped with Si and comprising a low indium (In) composition and a second layer formed on the first layer, doped with an n-type dopant except Si, and comprising an indium (In) composition higher than the first layer;
an emitter electrode formed on the n-type InGaAs uniform composition layer;
a base electrode formed on the p-type base layer; and
a collector electrode formed on the n-type sub-collector layer.

Advantages of the Invention

The invention can provide a transistor epitaxial wafer comprising an n-type InGaAs non-alloy layer with a sufficiently low resistance and an improved surface flatness. Therefore, in producing a heterojunction bipolar transistor or a high electron mobility transistor by using the transistor epitaxial wafer, good ohmic contact can be obtained. Thus, the power consumption can be reduced and the emitter injection efficiency can be improved.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Consideration of Non-alloy Layer

As described above, even if Se is doped into the uniform composition layer 16 of the n-type InGaAs non-alloy layer 14 and Si is doped into the linear graded layer 15 of the n-type InGaAs non-alloy layer, in some growth conditions such as the In composition, the resistance of the linear graded layer 15 does not become low. Therefore, the inventors further investigated the n-type InGaAs non-alloy layer 14 in view of a raw material in a case of being grown by an epitaxy.

In a case that the n-type InGaAs non-alloy layer 14 is grown by the epitaxy, trimethyl indium (TMI: $In(CH_3)_3$) as an In material, triethyl gallium (TEG: $Ga(C_2H_5)_3$) as a Ga material, and arsine gas ($AsH_3$) as an As material are generally used. Further, selenium gas ($H_2Se$) or disilane gas ($Si_2H_6$) is used as a material gas of the n-type dopant. Furthermore, the "n-type" is realized by that Se or Si is doped into the n-type InGaAs non-alloy layer 14.

A carbon (C) is included in the TMI and the TEG of the materials. This C is inevitably mixed to the non-alloy layer 16 as a background concentration, in a case of a making method of the vapor-phase epitaxial method. C is the "p-type", so that if the C background concentration is high a part of the "n-type" of Se or Si is negated and as a result a resistance value of the linear graded layer 15 is raised. It is presumed that the C background concentration raising the resistance value has some relationship with the In composition of the linear graded layer 15 and the dopant.

Therefore, the inventors focused attention on the C background concentration and considered the relationship between the In composition and the dopant by SIMS (secondary ion mass spectrometry).

Analysis Result of Non-Alloy Layer

Figure 2:
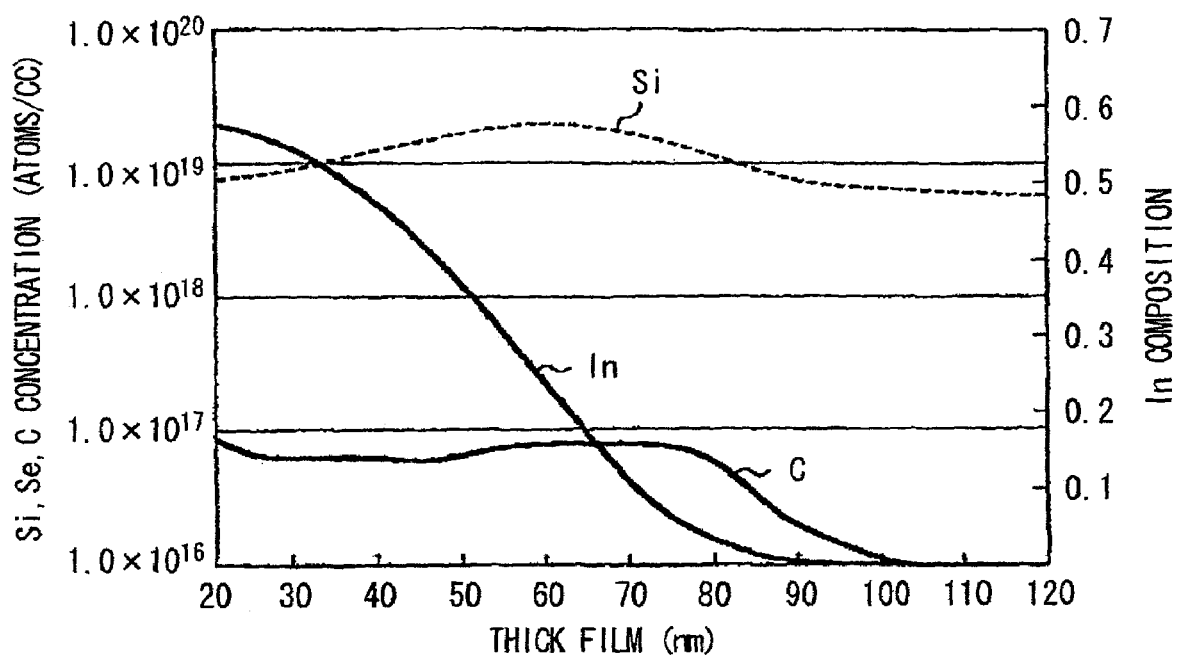
FIG. 2 is a graph showing a SIMS analysis profile of a non-alloy layer in a case that Si is doped into a graded layer.

FIG. 2 is a graph showing the SIMS analysis profile of the on-alloy layer in a case that Si is doped into the graded layer. As is clear from FIG. 2, when Si as the n-type dopant is doped into the linear graded layer 15 where the In composition fluctuates, the C background concentration (shown as C in FIG. 2) in the linear graded layer 15 is less than $1 \times 10^{17}$ atoms/cc ($1 \times 10^{17}$ cm$^{-3}$) independently of a high or low level of the In composition. However, it is understood that Si is mixed only to an extent of $1 \times 10^{19}$ cm$^{-3}$ in the Si concentration and a carrier concentration does not become high.

Figure 3:
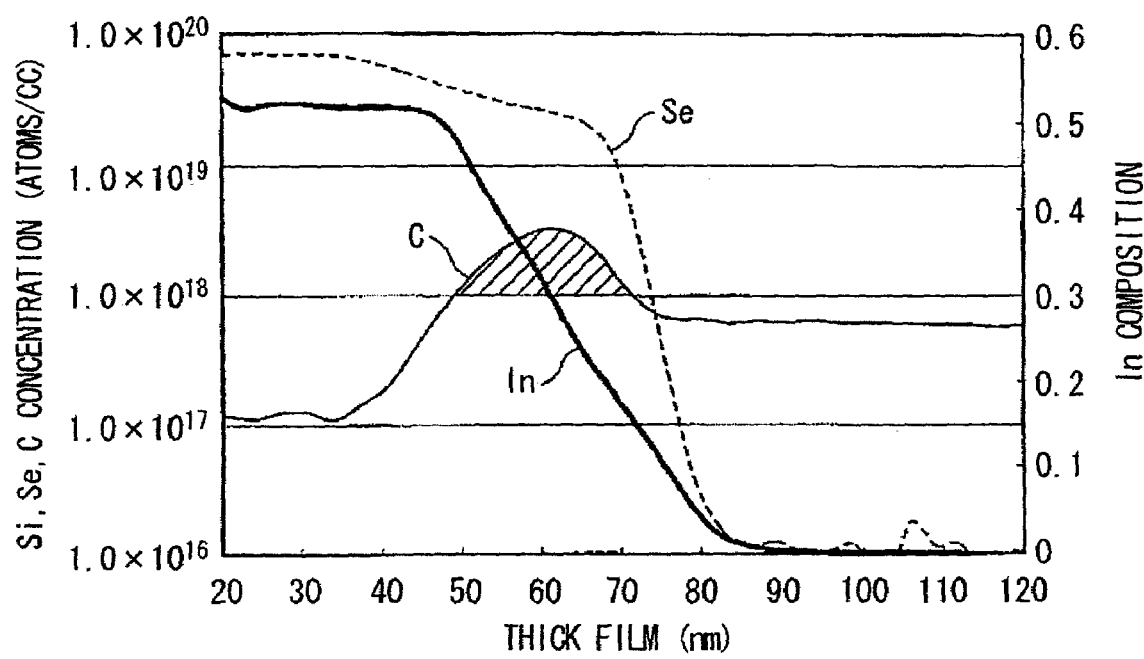
FIG. 3 is a graph showing a SIMS analysis profile of a non-alloy layer in a case that Se is doped into a graded layer.

FIG. 3 is a graph showing the SIMS analysis profile of the non-alloy layer in a case that Se is doped into the graded layer. As is clear from FIG. 3, when Se as the n-type dopant is doped into the linear graded layer 15 where the In composition fluctuates linearly, the Se concentration is so high as $1 \times 10^{19}$ cm$^{-3}$ to $1 \times 10^{20}$ cm$^{-3}$ independently of a high or low level of the In composition. Further, as to the C background concentration (shown as C in FIG. 3), it is understood that a low C concentration of not more than $1 \times 10^{18}$ cm$^{-3}$ is shown in the linear graded layer 15 with a high In composition of more than 0.35, but as shown at a shaded area in FIG. 3 a high C concentration of $1 \times 10^{18}$ cm$^{-3}$ to $3 \times 10^{18}$ cm$^{-3}$ exists in the linear graded layer 15 comprising a low In composition of 0 to 0.35. It is judged that the high concentration portion becomes a high resistance component. Further, the high concentration component leads to an increase in an electric power consumption of the HBT and a decrease in injection efficiency by a heat generation.

Therefore, it is preferable to dope Si into a lower layer of the linear graded layer 15 and to dope Se into an upper layer thereof, instead of doping Si into the whole area thereof. In this case, it becomes problematic that to what extent Se must be doped, that is, to what place a boundary between the lower layer and the upper layer must be determined. In order to solve the problem, from the above analysis result, it is preferable that Si of the n-type dopant is doped into a layer comprising the In composition of 0 to 0.35 of the linear graded layer 15 so that a portion comprising a high C background concentration (the shaded area in FIG. 3) does not appear. Further, the following is presumed. That is, it is preferable that Se instead of Si is doped into a layer comprising the In composition of more than 0.35 so as to raise the n-type dopant concentration.

Figure 5:
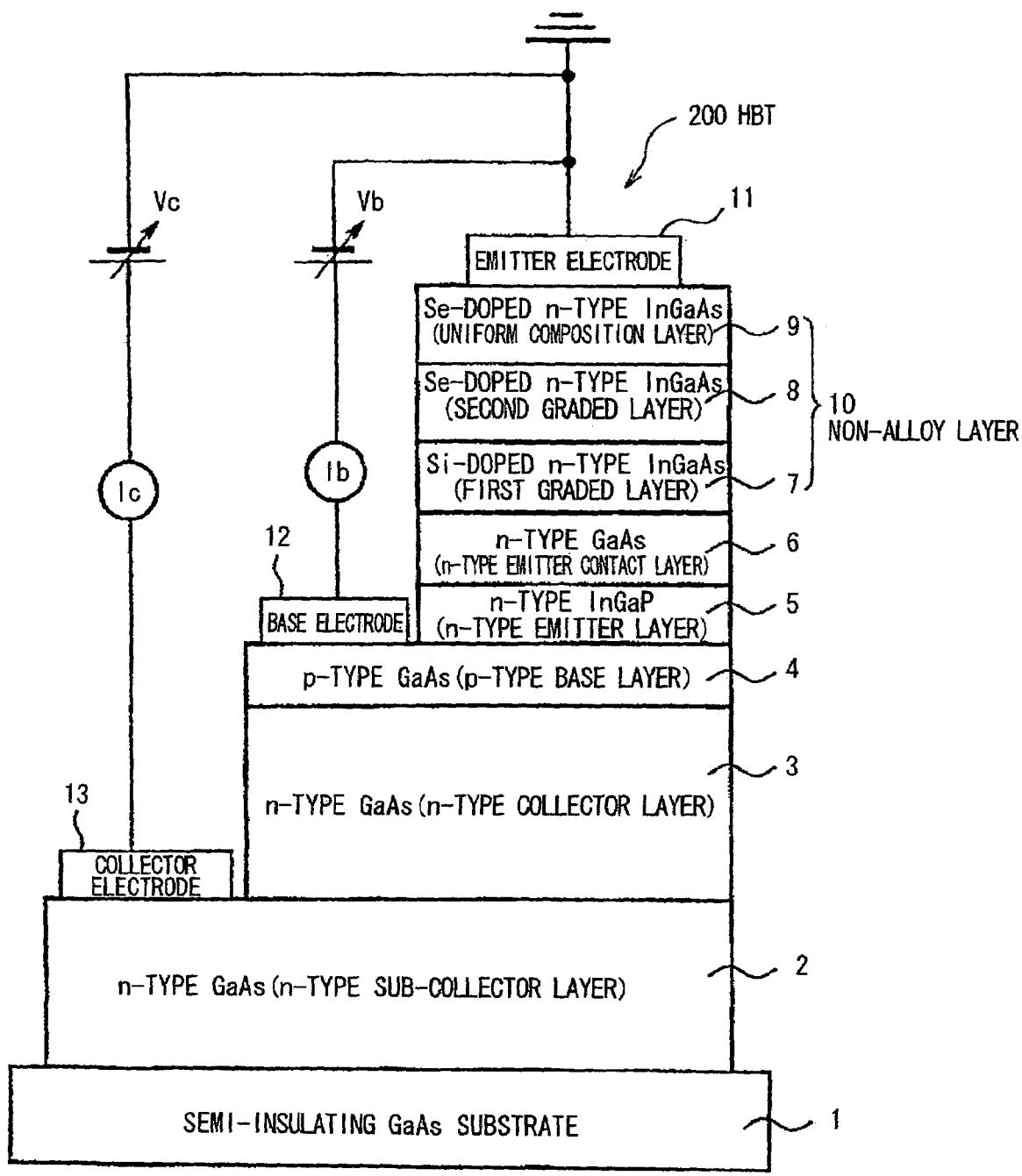
FIG. 5 is a diagram showing a structure of a heterojunction bipolar transistor in a second preferred embodiment according to the invention.

Therefore, an HBT shown in FIG. 5 was produced by steps of doping Si into a layer comprising the In composition of 0 to 0.35 and doping Se into a layer comprising the In composition of more than 0.35, of the linear graded layer 15 actually constituting the n-type InGaAs non-alloy layer 14, so as to produce an epitaxial wafer for the HBT, by using the wafer forming the emitter electrode 11 on the uniform composition layer comprising a uniform composition, forming the base electrode 12 on the base layer 4, and forming the collector electrode 13 on the sub-collector layer 2.

Figure 4:
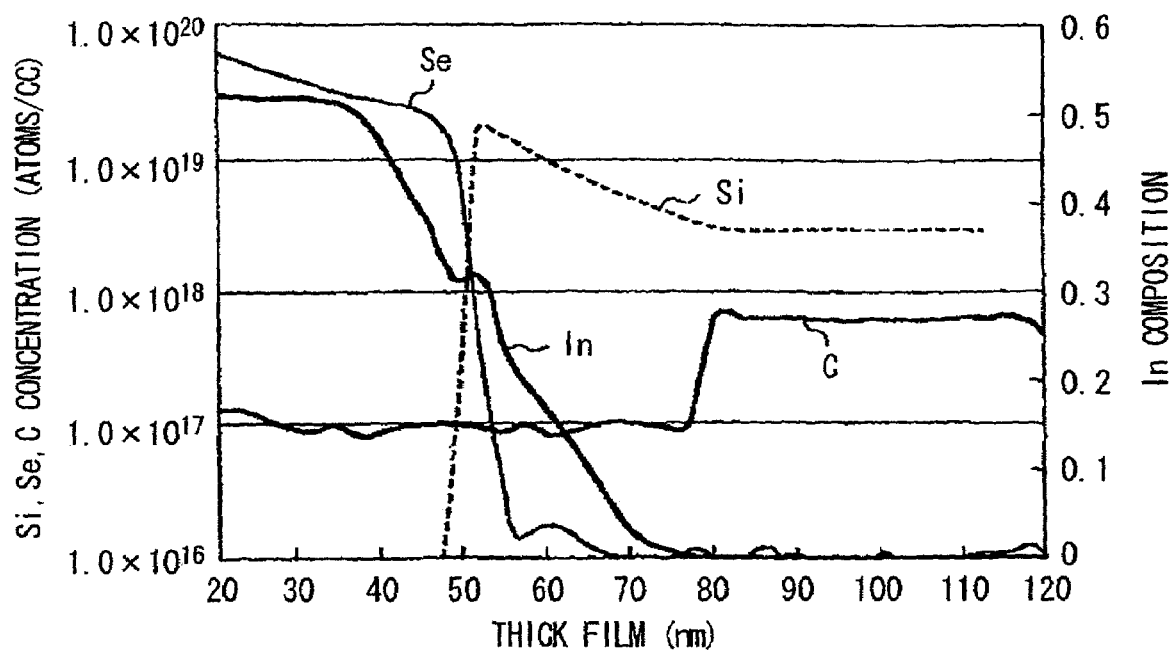
FIG. 4 is a graph showing a SIMS analysis profile of a non-alloy layer of a HBT epitaxial wafer in a case that Si and Se are doped into a linear graded layer according to an In composition.

FIG. 4 is a graph showing a SIMS analysis profile of a non-alloy layer of a HBT epitaxial wafer in a case that Si and Se are doped into a linear graded layer according to an In composition. As presumed, the Se concentration could be raised to a high level of $1 \times 10^{19}$ cm$^{-3}$ in the layer comprising the In composition of more than 0.35. Further, the C background concentration of the linear graded layer 15 was decreased to an extent of $1 \times 10^{17}$ cm$^{-3}$ over the whole area of the In composition.

First Embodiment

Figure 1:
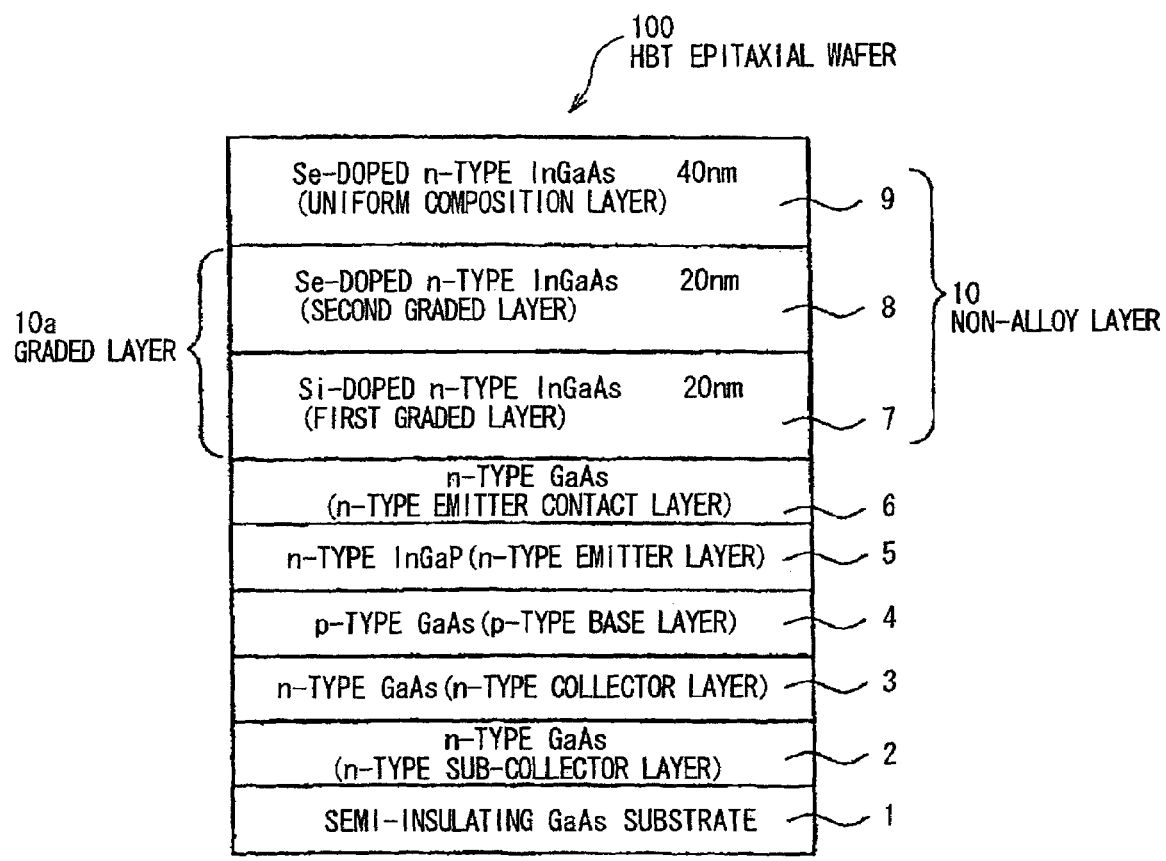
FIG. 1 is a diagram showing a structure of an HBT epitaxial wafer in a first preferred embodiment according to the invention.

FIG. 1 is a diagram showing a composition of an HBT epitaxial wafer (i.e., an epitaxial wafer used for the production of an HBT) in the first preferred embodiment according to the invention. The HBT epitaxial wafer 100 is obtained according to the above analysis result, that is, in an $In_{0 \to x}Ga_{1 \to 1-x}As$ graded layer 10a of an n-type InGaAs non-alloy layer 10, as dopants Si is doped into a portion comprising the In composition of 0 to 0.35 and Se is doped into a remaining portion comprising the In composition of 0.35 to a uniform In composition.

The HBT epitaxial wafer 100 comprises a semi-insulating GaAs substrate 1, and the following multilayer formed on the semi-insulating GaAs substrate 1 in order, the multilayer comprising an n-type sub-collector layer 2 comprising an n-type GaAs layer (e.g. a thickness of 500 nm, a carrier concentration of $3 \times 10^{18}$ cm$^{-3}$), an n-type collector layer 3 comprising an n-type GaAs layer (e.g. a thickness of 700 nm, a carrier concentration of $1 \times 10^{16}$ cm$^{-3}$), a p-type base layer 4 comprising a p-type GaAs layer (e.g. a thickness of 80 nm, a carrier concentration of $4 \times 10^{19}$ cm$^{-3}$), an n-type emitter layer 5 comprising an n-type $In_xGa_{1-x}P$ layer (x=0.48) (e.g. a thickness of 40 nm, a carrier concentration of $3 \times 10^{17}$ cm$^{-3}$), an n-type emitter contact layer 6 comprising an n-type GaAs layer (e.g. a thickness of 100 nm, a carrier concentration of $3\times10^{18}$ cm$^{-3}$), and an n-type InGaAs non-alloy layer 10 (e.g. a thickness of 80 nm).

The n-type InGaAs non-alloy layer 10 comprises a graded layer 10a (e.g. a thickness of 40 nm) where the In composition is gradually raised from 0 and a uniform composition layer 9 (e.g. a thickness of 40 nm) comprising a uniform In composition, and a final value of the In composition of the graded layer 10a corresponds to a value of the In composition of the uniform composition layer.

The graded layer 10a is separated into two layers which comprise an n-type first graded layer 7 comprising an n-type $In_xGa_{1-x}As$ layer (x=0→0.35) (e.g. a thickness of 20 nm) and an n-type second graded layer 8 comprising an n-type $In_xGa_{1-x}As$ layer (x=0.35→0.5) (e.g. a thickness of 20 nm).

Further, the uniform composition layer 9 comprises an Se doped n-type $In_xGa_{1-x}As$ layer (x=0.5) (e.g. a thickness of 40 nm, a carrier concentration of more than $1\times10^{19}$ cm$^{-3}$).

The first graded layer 7 is doped with Si acting so as to suppress the C background concentration low. The carrier concentration is set to more than $5\times10^{18}$ cm$^{-3}$. A growth temperature of the first graded layer 7 is set to 450 to 750° C., preferably 500 to 600° C. The second graded layer 8 is doped with Se acting so as to raise the carrier concentration. The carrier concentration is set to more than $1\times10^{19}$ cm$^{-3}$. A growth temperature of the second graded layer 8 is preferably set to 400 to 550° C. Further, it is more preferable that the growth temperature of the second graded layer 8 is lower than that of the first graded layer 7.

A measurement result of a distribution of C, Se, Si, and In composition in the HBT epitaxial wafer 100 by a secondary ion mass spectrometry is shown in FIG. 4 explained above. Further, measurement results of distributions of the compositions of the HBT epitaxial wafer 100 when Se and Si are doped into the whole area of the graded layer 10a respectively are shown in FIGS. 2, 3 explained above.

Advantages of the First Embodiment

According to the first preferred embodiment, the following advantages are achieved.

In a case that the n-type InGaAs graded layer 10a comprises the first graded layer 7 comprising a low In composition and the second graded layer 8 comprising the In composition higher than the first graded layer 7, and Si is doped into the first graded layer 7 and Se is doped into the second graded layer 8, it becomes problematic that to what place a boundary between the first graded layer 7 and the second graded layer 8 must be determined, but being focused attention on the C background concentration, the boundary between the first graded layer 7 and the second graded layer 8 are determined according to the In composition, so that an increase in a resistance of the n-type InGaAs non-alloy layer 10 can be suppressed, the increase in the resistance being caused by a high resistance component generated by a high C background concentration.

The high resistance component leads to an increase in an electric power consumption of the HBT produced from the wafer and an decrease in an injection efficiency by a heat generation, but the C background concentration can be suppressed, so that the problem described above can be solved. Further, it becomes unnecessary to dope the n-type dopant such as Se in excess in order to eliminate the high resistance component, so that a problem of a furnace memory effect by the n-type dopant such as Se caused by the above can be also solved.

Further, Si of the n-type dopant is doped into the first graded layer 7 comprising a low In composition of 0 to 0.35, so that the C background concentration can be suppressed to a low level and the carrier concentration can also be maintained to a high level to a certain extent. And, Se is doped into the second graded layer 8 comprising a high In composition of more than 0.35, so that the C background concentration can be maintained to a low level and a high carrier concentration of more than $1\times10^{19}$ cm$^{-3}$ can also be obtained. As the result, the graded layer 10a comprising a lower resistance can be realized, in comparison with a case that the graded layer 10a is doped with Si.

Furthermore, when Si is doped into the whole area of the graded layer 10a the growth temperature of InGaAs would be raised, so that the surface flatness becomes bad, but in the embodiment Si is doped into only the first graded layer 7 and Se is doped into the remaining second graded layer 8 of the graded layer 10a, so that the surface flatness is improved and the InGaAs layer comprising a flat surface can be obtained.

Second Embodiment

FIG. 5 is a diagram showing a structure of an HBT in the second preferred embodiment according to the invention. The HBT 200 comprises the epitaxial wafer in the first preferred embodiment shown in FIG. 1.

The HBT 200 mainly comprises the semi-insulating GaAs substrate 1, and the following multilayer formed on the semi-insulating GaAs substrate 1 in order, the multilayer comprising the n-type sub-collector layer 2 comprising the n-type GaAs layer, the n-type collector layer 3 comprising the n-type GaAs layer, the p-type base layer 4 comprising a p-type GaAs layer, the n-type emitter layer 5 comprising the n-type $In_xGa_{1-x}P$ layer (x=0.48), the n-type emitter contact layer 6 comprising the n-type GaAs layer, and the n-type InGaAs non-alloy layer 10.

The n-type InGaAs non-alloy layer 10 comprises the first graded layer 7 doped with Si, the second graded layer 8 doped with Se, and the uniform composition layer 9 comprising the n-type $In_xGa_{1-x}As$ layer (x=0.5) doped with Se.

Further, the emitter electrode 11 is formed on the uniform composition layer 9, the base electrode 12 is formed on the p-type base layer 4, and the collector electrode 13 is formed on the n-type sub-collector layer 2. In a case of being operated by a grounded emitter, positive voltages Vb, Vc are applied to the base electrode 12 and the collector electrode 13, a base current Ib as a signal input is applied from the base electrode 12 and a collector current Ic to be an output is controlled so as to operate as a transistor.

Advantages of the Second Embodiment

According to the second preferred embodiment, the HBT comprises the epitaxial wafer comprising advantages described in the first preferred embodiment, so that the HBT comprising a reduced electric power consumption and an improved emitter injection efficiency can be obtained.

Other Embodiments

For example, in the above preferred embodiments the In composition of the uniform composition layer 9 is fixed to 0.5, but the uniform In composition can be fixed to any value of 0.4 to 0.7.

Further, a case that the n-type InGaAs nonuniform composition layer (the graded layer 10a) is the linear graded layer where the In composition is gradually raised from 0 is explained, but it can be a step graded layer where the In composition is changed in a step shape. And, an nonuniform composition layer can be adopted instead of the graded layer, the nonuniform composition layer comprising a first layer comprising a ranged In composition from 0 to 0.35, and a second layer comprising a ranged In composition from 0.35 to a In composition value of the uniform composition layer.

Furthermore, in the above preferred embodiments Se is used as the n-type dopant of the second layer, but the Te can be doped instead of Se. And, as a material of the substrate 1 Si or InP instead of GaAs can be used.

EXAMPLES

A transistor epitaxial wafer according to the invention will be detailed below with reference to the following Examples.

Example 1

A HBT epitaxial wafer in Example 1 was formed so as to comprise an identical composition to the HBT epitaxial wafer 100 shown in the first preferred embodiment. That is, the wafer in Example 1 comprises the GaAs substrate 1, and the following multilayer formed on the GaAs substrate 1 in order, the multilayer comprising the Si-GaAs sub-collector layer 2, the Si-GaAs collector layer 3, the C-GaAs base layer 4, the Si-InGaP emitter layer 5, the Si-GaAs emitter contact layer 6, and the non-alloy layer 10. Further, the non-alloy layer 10 was formed so as to comprise Si doped $In_{0\to0.35}GaAs$ as the first graded layer 7, a Se doped $In_{0.35\to x}GaAs$ as the second graded layer 8, and a Se doped $In_xGaAs$ as the uniform composition layer 9. The X in the formula was set to 0.4, 0.5 and 0.6 as shown in Table 1. Table 1 shows evaluation results of and Comparative Examples 1 to 3.

Examples 1 to 3 comprise a same layer structure (from the GaAs substrate 1 to the Si-GaAs emitter contact layer 6) and a same layer composition as that of Example 1, but the wafers comprise a different composition in the non-alloy layer 10 from the layer of Example 1.

Figure 9A:
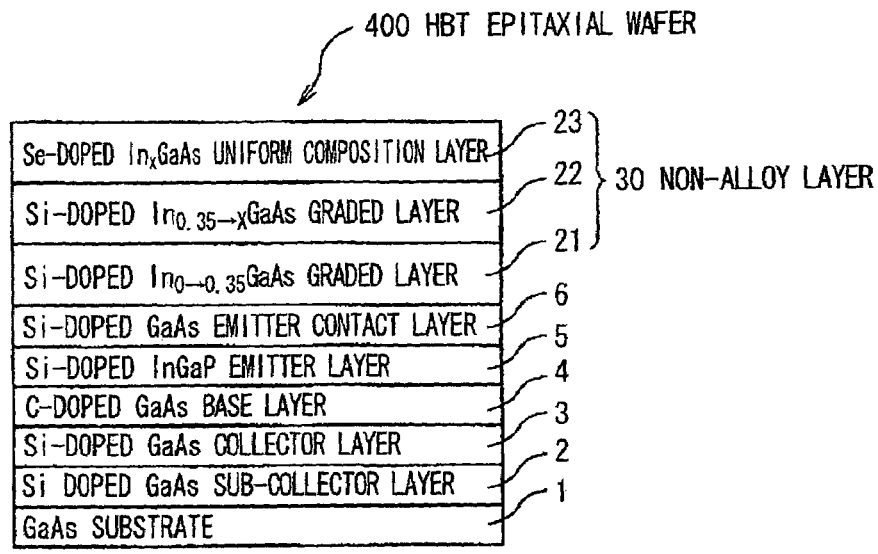
FIG. 9A is a diagram showing a structure of an HBT epitaxial wafer in Comparative Example 1.
Figure 9B:
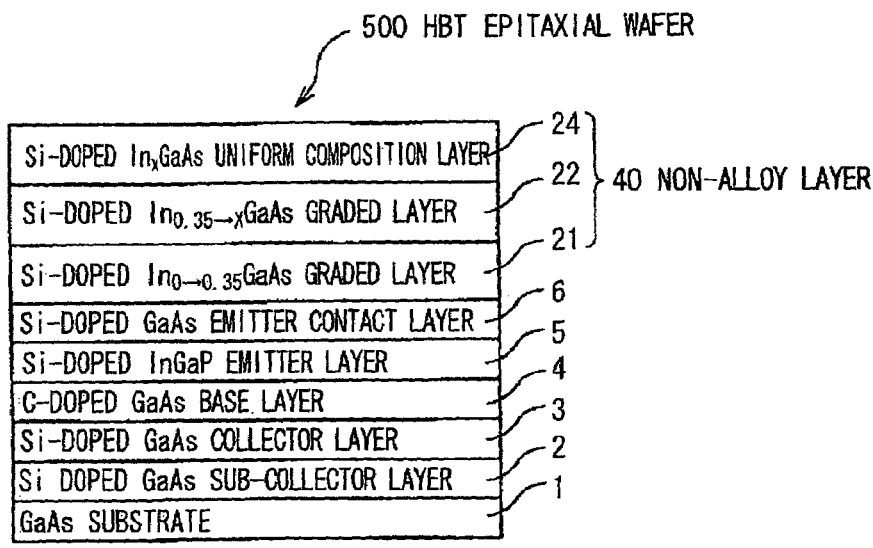
FIG. 9B is a diagram showing a structure of an HBT epitaxial wafer in Comparative Example 2.
Figure 9C:
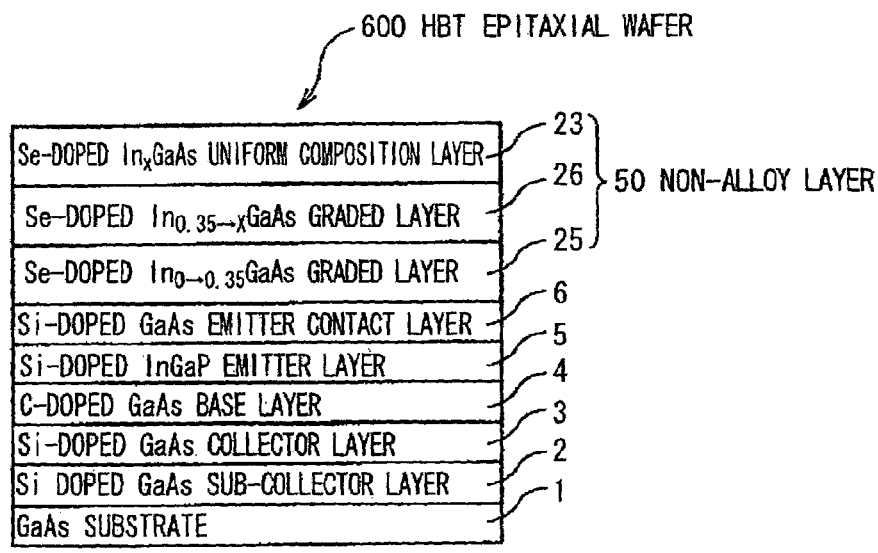
FIG. 9C is a diagram showing a structure of an HBT epitaxial wafer in Comparative Example 3.

Each of the HBT epitaxial wafers in Comparative Examples 1 to 3 was formed so as to comprise an identical composition to the epitaxial wafer shown in FIGS. 9A, 9B and 9C respectively.

As shown FIG. 9A, the HBT epitaxial wafer 400 in Comparative Example 1 comprises a non-alloy layer 30 comprising a graded layer 21 of Si doped $In_{0.35\to x}GaAs$, a graded layer 22 of Si doped $In_{0.35\to x}GaAs$, and a uniform composition layer 23 of a Se doped $In_xGaAs$, formed on the n-type GaAs emitter contact layer 6 in order. The X in the formula was set to 0.4, 0.5 and 0.6 as shown in Table 1.

As shown FIG. 9B, the HBT epitaxial wafer 500 in Comparative Example 2 comprises a non-alloy layer 40 comprising the graded layer 21 of the Si doped $In_{0\to0.35}GaAs$, the graded layer 22 of the Si doped $In_{0.35\to x}GaAs$, and a uniform composition layer 24 of Si doped $In_xGaAs$, formed on the n-type GaAs emitter contact layer 6 in order. The X in the formula was set to 0.4, 0.5 and 0.6 as shown in Table 1.

As shown FIG. 9C, the HBT epitaxial wafer 600 in Comparative Example 3 comprises a non-alloy layer 50 comprising a graded layer 25 of a Se doped $In_{0\to0.35}GaAs$, a graded layer 26 of a Se doped $In_{0.35\to x}GaAs$, and the uniform composition layer 23 of Se doped $In_xGaAs$, formed on the n-type GaAs emitter contact layer 6 in order. The X in the formula was set to 0.4, 0.5 and 0.6 as shown in Table 1.

As is clear from Table 1, Example 1 is comparable in an evaluation of the simple reliability to Comparative Example

TABLE 1

| | In Composition of InGaAs Uniform Composition Layer (x) | Haze (average) (ppm) | Contact Resistance (ohm/cm$^2$) | Vertical Resistance (ohm · cm) | Simple Reliability (Rate of Change) | Se Memory Concentration in Collector Layer (cm$^{-3}$) |
|---|---|---|---|---|---|---|
| Ex. 1 | 0.4 | 121 | — | — | — | — |
| | 0.5 | 220 | $1.58 \times 10^{-7}$ | 3.2 | 0.97 | LDL |
| | 0.6 | 500 | — | — | — | — |
| Com. 1 | 0.4 | 130 | — | — | — | — |
| | 0.5 | 260 | $2.00 \times 10^{-7}$ | 7.3 | — | $1.30 \times 10^{15}$ |
| | 0.6 | 800 | — | — | — | — |
| Com. 2 | 0.4 | — | — | — | — | — |
| | 0.5 | 2310 | $5.70 \times 10^{-7}$ | — | — | none |
| | 0.6 | — | — | — | — | — |
| Com. 3 | 0.4 | 111 | — | — | — | — |
| | 0.5 | 207 | $1.50 \times 10^{-7}$ | 5.0 | 0.98 | $1.00 \times 10^{15}$ |
| | 0.6 | 470 | — | — | — | — |

In Table 1, "Vertical Resistance" means a resistance between a base layer and an emitter layer in a depth direction, "Simple reliability" means a rate of change in a current test of 100 KA/cm$^2$, "Se Memory Concentration in Collector Layer" means a Se concentration mixed into a collector layer at the second epitaxial growth when the epitaxial growth is conducted continuously, and "LDL" means a lower detection limit.

Comparative Examples 1 to 3

Epitaxial wafers in Comparative Examples 1 to 3 were formed similarly to Example 1, except for the composition of the non-alloy layer 10. That is, the wafers in Comparative 3, and is superior in a comprehensive evaluation including the surface flatness, the contact resistance, and the vertical resistance to Comparative Examples 1 to 3. Further, the reason why in Table 1 the Se memory concentration in the collector layer of the Comparative Example 2 is shown as "none" is Se was not used.

Figure 6:
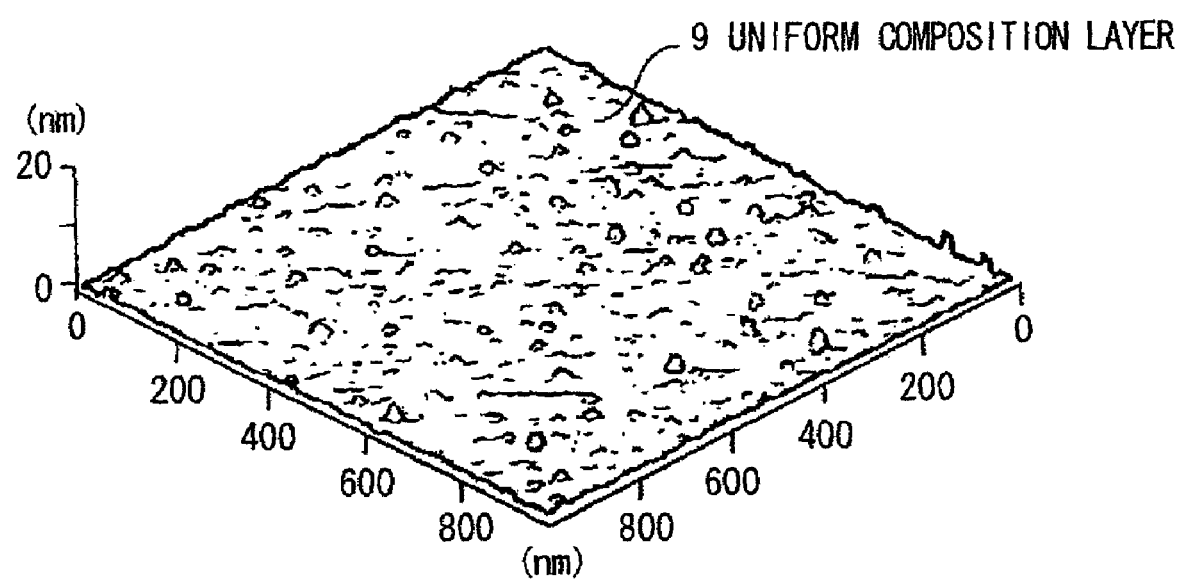
FIG. 6 is a perspective view showing a surface condition of a non-alloy layer in a case that the non-alloy layer is etched by an acid based etchant in an epitaxial wafer for a heterojunction bipolar transistor according to the invention.
Figure 7:
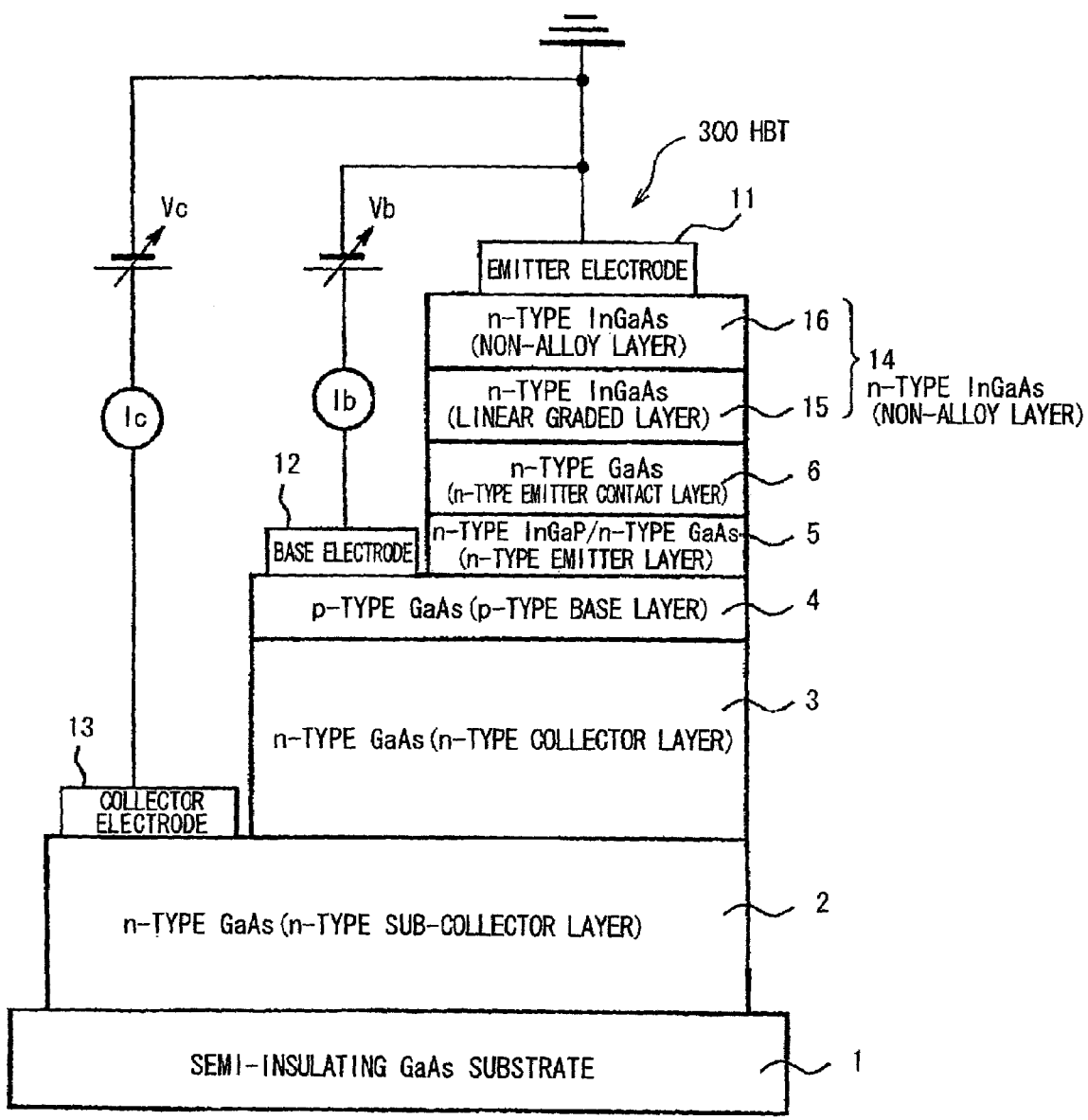
FIG. 7 is a diagram showing a structure of a conventional a heterojunction bipolar transistor.
Figure 8:
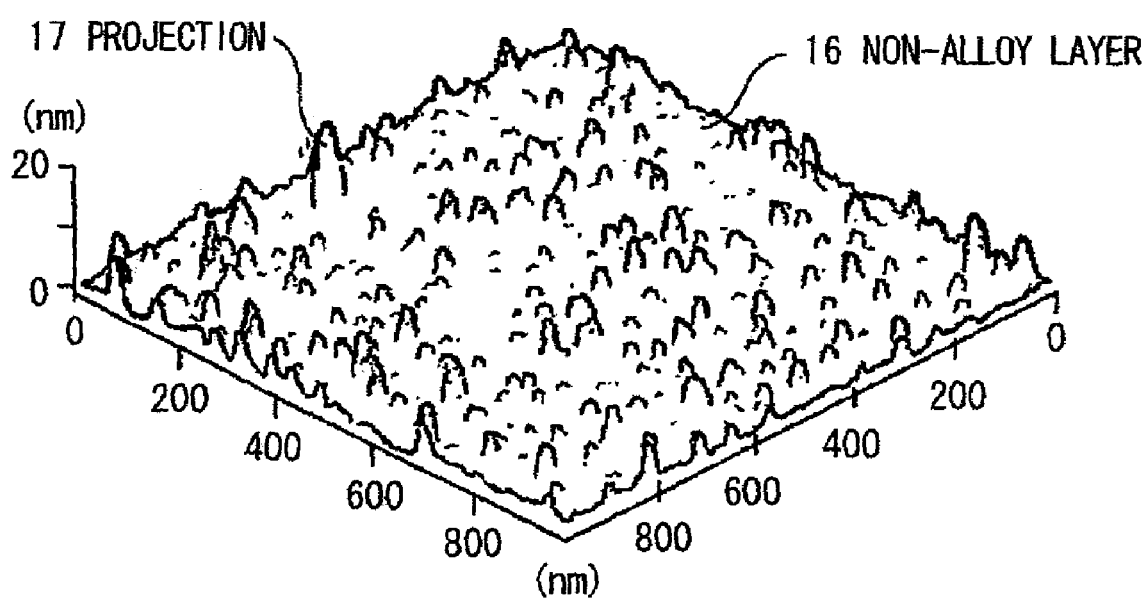
FIG. 8 is a perspective view showing a surface condition of a non-alloy layer in a case that the non-alloy layer is etched by an acid based etchant in a conventional epitaxial wafer for a heterojunction bipolar transistor.

FIG. 6 is a perspective view showing a surface condition of the non-alloy layer 10a in a case that the non-alloy layer 10a is etched by an acid based etchant in the HBT epitaxial wafer 100. As is clear from comparing FIG. 6 and FIG. 8, Example 1 comprises a good surface flatness since Se is doped into the uniform composition layer 9.

Example 2

Figure 10A:
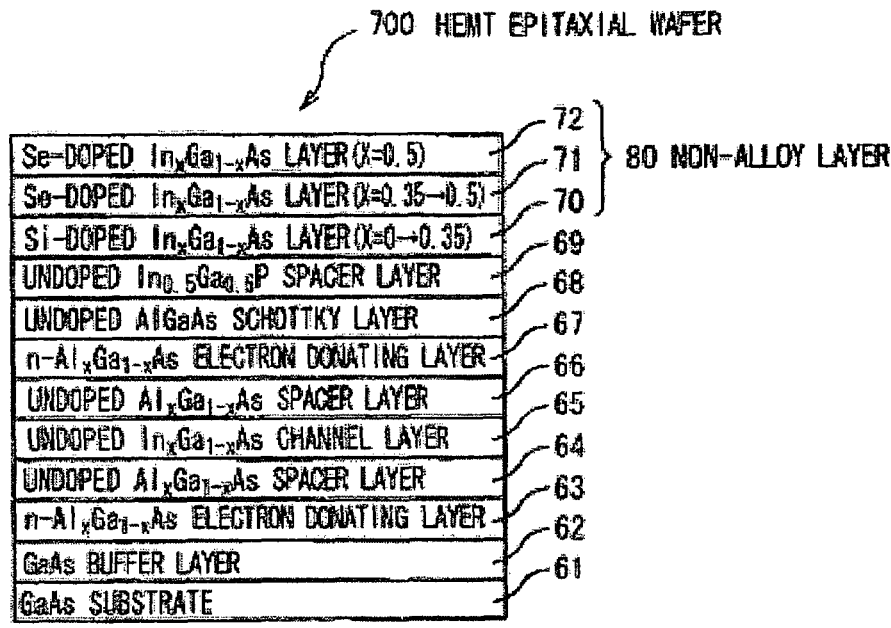
FIG. 10A is a diagram showing a structure of a high electron mobility transistor in Example 2 of the invention.
Figure 10B:
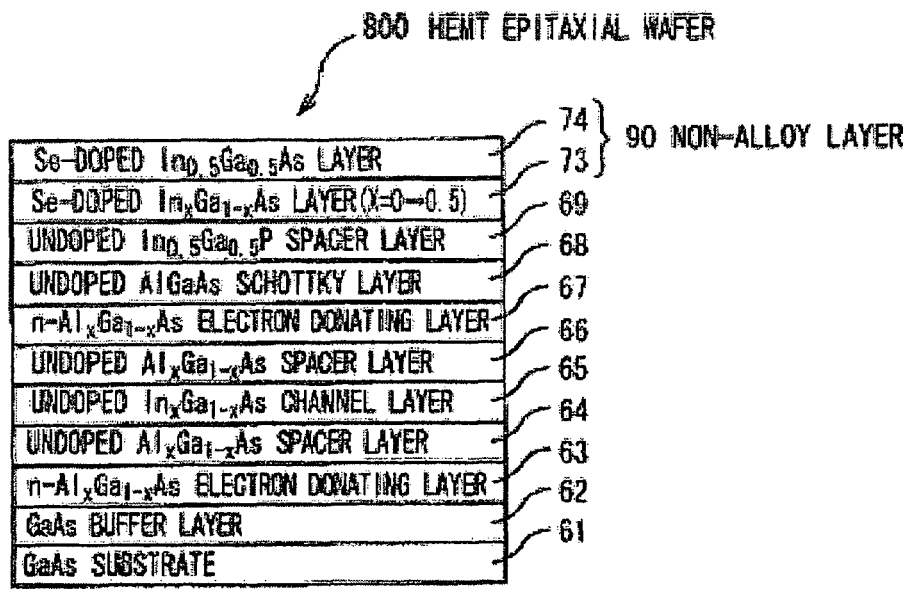
FIG. 10B is a diagram showing a structure of a high electron mobility transistor in Comparative Example 4.

FIG. 10A is a diagram showing a structure of a high electron mobility transistor in Example 2 of the invention, and FIG. 10B is a diagram showing a structure of a high electron mobility transistor in Comparative Example 4.

An epitaxial wafer 700 for a high electron mobility transistor (HEMT) in Example 2 was formed so as to comprise a semi-insulating GaAs substrate 61, and the following multilayer formed on the semi-insulating GaAs substrate 61 in order, the multilayer comprising an undoped GaAs buffer layer 62, a Si-doped n-type electron donating layer 63, an undoped $Al_xGa_{1-x}As$ spacer layer 64, an undoped $In_xGa_{1-x}As$ channel layer 65, an undoped $Al_xGa_{1-x}As$ spacer layer 66, a Si-doped n-type electron donating layer 67, an undoped $Al_xGa_{1-x}As$ Schottky layer 68, and an undoped InGaP spacer layer 69, and further the wafer 700 was formed so as to comprise a non-alloy layer 80 comprising an n-type first graded layer of an n-type $In_xGa_{1-x}As$ layer 70 (x=0→0.35) (e.g. a thickness of 20 nm), an n-type second graded layer of an n-type $In_xGa_{1-x}As$ layer 71 (x=0.35→0.5) (e.g. a thickness of 20 nm), and a Se doped n-type $In_xGa_{1-x}As$ layer 72 (x=0.5) (e.g. a thickness of 40 nm, a carrier concentration of more than $1\times10^{19}$ cm$^{-3}$) formed on the spacer layer 69 in order.

Comparative Example 4

An epitaxial wafer 800 for HEMT in Comparative Example 4 was formed similarly to the epitaxial wafer 700 for HEMT in Example 2 so as to comprise the semi-insulating GaAs substrate 61, and the crystal growth layer (the buffer layer 62 to the spacer layer 69) formed on the substrate 61 in order, and further the wafer 800 was formed so as to comprise the non-alloy layer 90 comprising a Se doped n-type $In_xGa_{1-x}As$ layer 73 (x=0→0.5) and a Se doped n-type $In_xGa_{1-x}As$ layer 74 (x=0.5) formed on the spacer layer 69 in order.

A high electron mobility transistor produced by using the epitaxial wafer 700 for HEMT in Example 2, in comparison with Comparative Example 4 of a conventional structure and similarly to a case of the HBT, was decreased not only in vertical resistance but also in Se memory concentration (conventional case: $1\times10^{17}$ cm$^{-3}$, case of the invention: $1\times10^{16}$ cm$^{-3}$) due to a decrease effect in total flow rate of Se (conventional case: 0.9 L, case of the invention: 0.7 L) which is used for producing the non-alloy layer. Further, mobility as an important concept in the epitaxial wafer for HEMT is shown in Table 2.

TABLE 2

| | Example 2 | Com. Example 4 |
|---|---|---|
| Pinch-Off Voltage Vp (V) | 2.5 | 2.5 |
| Mobility (cm$^2$/V · s) | 5600 | 5450 |
| Haze (average) (ppm) | 215 | 228 |
| Se Memory Concentration in GaAs buffer Layer (cm$^{-3}$) | $1.0 \times 10^{16}$ | $1.0 \times 10^{17}$ |

As shown in Table 2, in a case of adopting the structure shown in Example 4, a characteristic deterioration was not generated. Further, Example 2 was equal or excellent to Comparative Example 4 in the mobility (Example 2: 5600 cm$^2$/V·s at the pinch-off voltage Vp of 2.5 V, Comparative Example 4: 5450 cm$^2$/V s at the pinch-off voltage Vp of 2.5 V), and in Example 2 an advantage of a decease in the C background concentration was achieved.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A transistor epitaxial wafer, comprising:

a substrate;

an n-type collector layer, a p-type base layer, and an n-type emitter layer formed on the substrate in this order; and an n-type InGaAs non-alloy layer comprising an n-type InGaAs nonuniform composition layer formed on the n-type emitter layer and comprising an nonuniform indium (In) composition, and an n-type InGaAs uniform composition layer formed on the n-type InGaAs nonuniform composition layer and comprising a uniform indium (In) composition, wherein the n-type InGaAs nonuniform composition layer comprises a first layer doped with Si and comprising a low indium (In) composition, and a second layer formed on the first layer, doped with an n-type dopant except Si, and comprising an indium (In) composition higher than the first layer.

2. The transistor epitaxial wafer according to claim 1, wherein:

the n-type InGaAs nonuniform composition layer comprises a graded layer comprising an In composition gradually increased from 0, the first layer comprises an In composition of 0 to 0.35, the second layer comprises an In composition of more than 0.35, and a final value of the In composition of the second layer near an interface between the second layer and the uniform composition layer is substantially equal to the In composition of the uniform composition layer.

3. The transistor epitaxial wafer according to claim 1, wherein:

the first layer comprises an In composition of 0 to 0.35, and the second layer comprises an In composition in the range 0.35 to the In composition of the uniform composition layer.

4. The transistor epitaxial wafer according to claim 1, wherein:

the first layer comprises a carbon (C) background concentration of not more than $1\times10^{18}$ cm$^{-3}$ at the In composition thereof.

5. The transistor epitaxial wafer according to claim 1, wherein:

the n-type dopant except Si of the second layer comprises Se or Te.

6. The transistor epitaxial wafer according to claim 1, wherein:

the second layer comprises a carbon (C) background concentration of not more than $1\times10^{18}$ cm$^{-3}$ at the In composition thereof.

7. The transistor epitaxial wafer according to claim 1, wherein:

the n-type InGaAs uniform composition layer comprises Se or Te as an n-type dopant thereof.

8. The transistor epitaxial wafer according to claim 1, wherein:
the substrate comprises GaAs, Si or InP.

9. A transistor epitaxial wafer, comprising:
a substrate;
a buffer layer, an electron donating layer, a channel layer, and a Schottky layer formed on the substrate in this order; and
an n-type InGaAs non-alloy layer comprising an n-type InGaAs nonuniform composition layer formed on the Schottky layer and comprising an nonuniform indium (In) composition, and an n-type InGaAs uniform composition layer formed on the n-type InGaAs nonuniform composition layer and comprising a uniform indium (In) composition,
wherein the n-type InGaAs nonuniform composition layer comprises a first layer doped with Si and comprising a low indium (In) composition, and a second layer formed on the first layer, doped with an n-type dopant except Si, and comprising an indium (In) composition higher than the first layer.

10. The transistor epitaxial wafer according to claim 9, wherein:
the n-type InGaAs nonuniform composition layer comprises a graded layer comprising an In composition gradually increased from 0,
the first layer comprises an In composition of 0 to 0.35,
the second layer comprises an In composition of more than 0.35, and
a final value of the In composition of the second layer near an interface between the second layer and the uniform composition layer is substantially equal to the In composition of the uniform composition layer.

11. The transistor epitaxial wafer according to claim 9, wherein:
the first layer comprises an In composition of 0 to 0.35, and
the second layer comprises an In composition in the range 0.35 to the In composition of the uniform composition layer.

12. The transistor epitaxial wafer according to claim 9, wherein:
the first layer comprises a carbon (C) background concentration of not more than $1 \times 10^{18}$ cm$^{-3}$ at the In composition thereof.

13. The transistor epitaxial wafer according to claim 9, wherein:
the n-type dopant except Si of the second layer comprises Se or Te.

14. The transistor epitaxial wafer according to claim 9, wherein:
the second layer comprises a carbon (C) background concentration of not more than $1 \times 10^{18}$ cm$^{-3}$ at the In composition thereof.

15. The transistor epitaxial wafer according to claim 9, wherein:
the n-type InGaAs uniform composition layer comprises Se or Te as an n-type dopant thereof.

16. The transistor epitaxial wafer according to claim 9, wherein:
the substrate comprises GaAs, Si or InP.

17. A transistor, comprising:
a substrate;
an n-type sub-collector layer, an n-type collector layer, a p-type base layer, and an n-type emitter layer formed on the substrate in this order;
an n-type InGaAs non-alloy layer formed on the emitter layer, comprising an n-type InGaAs nonuniform composition layer and an n-type InGaAs uniform composition layer formed on the n-type InGaAs nonuniform composition layer and comprising a uniform indium (In) composition, the nonuniform composition layer comprising a first layer doped with Si and comprising a low indium (In) composition and a second layer formed on the first layer, doped with an n-type dopant except Si, and comprising an indium (In) composition higher than the first layer;
an emitter electrode formed on the n-type InGaAs uniform composition layer;
a base electrode formed on the p-type base layer; and
a collector electrode formed on the n-type sub-collector layer.

* * * * *